(12) United States Patent
Kuo et al.

(10) Patent No.: US 8,928,022 B2
(45) Date of Patent: Jan. 6, 2015

(54) LIGHT-EMITTING DEVICE

(71) Applicant: Epistar Corporation, Hsinchu (TW)

(72) Inventors: De-Shan Kuo, Hsinchu (TW);
Chun-Hsiang Tu, Hsinchu (TW);
Po-Shun Chiu, Hsinchu (TW);
Chun-Teng Ko, Hsinchu (TW);
Min-Hsun Hsieh, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 13/934,049

(22) Filed: Jul. 2, 2013

(65) Prior Publication Data
US 2013/0292643 A1 Nov. 7, 2013

Related U.S. Application Data

(63) Continuation-in-part of application No. 13/772,149, filed on Feb. 20, 2013, which is a continuation of application No. 12/753,551, filed on Apr. 2, 2010, now Pat. No. 8,405,106, which is a continuation-in-part of application No. 11/581,439, filed on Oct. 17, 2006, now abandoned.

(51) Int. Cl.
| | |
|---|---|
| *H01L 29/06* | (2006.01) |
| *H01L 33/22* | (2010.01) |
| *H01L 33/42* | (2010.01) |
| *H01L 33/10* | (2010.01) |
| *H01L 33/38* | (2010.01) |
| *H01L 33/40* | (2010.01) |

(52) U.S. Cl.
CPC ............. *H01L 33/22* (2013.01); *H01L 33/42* (2013.01); *H01L 33/10* (2013.01); *H01L 33/382* (2013.01); *H01L 33/405* (2013.01)

USPC .................................... 257/98; 257/E33.074

(58) Field of Classification Search
USPC ............................................ 257/98, E33.074
See application file for complete search history.

(56) References Cited

U.S. PATENT DOCUMENTS

| | | | |
|---|---|---|---|
| 5,414,281 | A | 5/1995 | Watabe et al. |
| 5,779,924 | A | 7/1998 | Krames et al. |
| 6,078,064 | A | 6/2000 | Ming-Jiunn et al. |
| 6,277,665 | B1 | 8/2001 | Ma et al. |
| 6,329,748 | B1 | 12/2001 | Kastalsky et al. |

(Continued)

FOREIGN PATENT DOCUMENTS

| | | |
|---|---|---|
| TW | 461124 | 10/2001 |
| WO | WO2006038665 | 4/2006 |

*Primary Examiner* — Mary Ellen Bowman
(74) *Attorney, Agent, or Firm* — Muncy, Geissler, Olds & Lowe, P.C.

(57) ABSTRACT

A light-emitting device comprising: a light-emitting stacked layer having a first conductivity type semiconductor layer; a light-emitting layer formed on the first conductivity type semiconductor layer; and a second conductivity type semiconductor layer formed on the light-emitting layer; a transparent conductive oxide layer formed on the second conductivity type semiconductor layer wherein the transparent conductive oxide layer having a first portion and a second portion and the upper surface of the transparent conductive oxide layer is a textured surface; a first electrode formed on the second portion of the transparent conductive oxide layer, and a second electrode formed on the first conductivity type semiconductor layer; a planarization layer formed on the first portion of the transparent conductive oxide layer, and the second electrode; and a reflective layer formed on the planarization layer that is devoid of the first electrode and the second electrode.

15 Claims, 20 Drawing Sheets

(56) References Cited

U.S. PATENT DOCUMENTS

| | | |
|---|---|---|
| 6,420,735 B2 | 7/2002 | Kim |
| 6,441,403 B1 | 8/2002 | Chang et al. |
| 6,495,862 B1 | 12/2002 | Okazaki et al. |
| 6,504,180 B1 | 1/2003 | Heremans et al. |
| 7,180,178 B2 | 2/2007 | Takashima et al. |
| 7,244,957 B2 | 7/2007 | Nakajo et al. |
| 7,291,865 B2 | 11/2007 | Kojima et al. |
| 7,355,210 B2 | 4/2008 | Ou et al. |
| 7,385,226 B2 | 6/2008 | Ou et al. |
| 7,504,667 B2 | 3/2009 | Fujikura et al. |
| 8,319,244 B2 * | 11/2012 | Jeong ............................... 257/98 |
| 2002/0145148 A1 | 10/2002 | Okuyama et al. |
| 2002/0179918 A1 | 12/2002 | Sung et al. |
| 2003/0047745 A1 | 3/2003 | Suzuki et al. |
| 2003/0119218 A1 | 6/2003 | Jang |
| 2003/0218179 A1 | 11/2003 | Koide et al. |
| 2004/0189184 A1 | 9/2004 | Yasuda |
| 2005/0104080 A1 | 5/2005 | Ichihara et al. |
| 2005/0211995 A1 | 9/2005 | Ou et al. |
| 2005/0224822 A1 | 10/2005 | Liu |
| 2005/0285136 A1 | 12/2005 | Ou et al. |
| 2005/0287687 A1 | 12/2005 | Liao et al. |
| 2006/0071226 A1 | 4/2006 | Kojima et al. |
| 2006/0076571 A1 | 4/2006 | Hsieh et al. |
| 2008/0054278 A9 | 3/2008 | Ou et al. |
| 2008/0135868 A1 | 6/2008 | Okagawa et al. |
| 2009/0078951 A1 | 3/2009 | Miki et al. |
| 2010/0213493 A1 * | 8/2010 | Hsu et al. ........................ 257/98 |
| 2013/0181245 A1 * | 7/2013 | Hsu et al. ........................ 257/98 |

\* cited by examiner

LIGHT-EMITTING DEVICE

REFERENCE TO RELATED APPLICATION

This application is a continuation-in-part of U.S. patent application Ser. No. 11/581,439, entitled "LIGHT-EMITTING APPARATUS", filed Oct. 17, 2006, and is a continuation application of U.S. patent application Ser. No. 13/178,323, entitled "OPTOELECTRONIC DEVICE AND METHOD FOR MANUFACTURING THE SAME", filed Jul. 7, 2011, and is a continuation application of U.S. patent application Ser. No. 13/772,149, entitled "LIGHT-EMITTING DEVICE", filed Feb. 20, 2013, now pending, the entire content of which is incorporated herein by reference in its entirety.

BACKGROUND

1. Technical Field

This application relates to a light-emitting diode device, and more particularly to a high light extraction light-emitting diode device.

2. Description of the Related Art

Light-emitting diode (LED) devices are widely used in different fields such as displays, traffic lights, data storage apparatus, communication apparatus, lighting apparatus, and medical apparatus. One important task for engineers is to increase the brightness of the LED devices.

In a known LED device, the semiconductor layer of the LED device having a textured surface can have higher light extraction efficiency. However, the textured surface can lower lateral current conduction and current spreading so the forward voltage is higher.

SUMMARY

A light-emitting device, comprising: a semiconductor contact layer having a rough top surface, wherein the rough top surface comprises any two adjacent crests having a highest point respectively and a trough having a lowest point between the two adjacent crests; and a transparent current spreading layer having a top surface on the semiconductor contact layer; wherein the top surface of the transparent current spreading layer comprises any two adjacent crests having a highest point respectively and a trough having a lowest point between the two adjacent crests; wherein the rough top surface of the semiconductor contact layer is substantially directly under the top surface of the transparent current spreading layer; wherein two oblique lines formed by connecting the highest points and the lowest point of the rough top surface on the semiconductor contact layer, and a first angle $\theta_1$ formed between the two oblique lines; wherein two oblique lines formed by connecting the highest points and the lowest point of the top surface on the transparent current spreading layer, and a second angle $\theta_2$ formed between the two oblique lines; wherein a difference between the first angle $\theta_1$ and the second angle $\theta_2$ is not greater than 10 degrees, or the first angle $\theta_1$ is substantially the same as the second angle $\theta_2$.

BRIEF DESCRIPTION OF THE DRAWINGS

The accompanying drawings are included to provide easy understanding of the application, and are incorporated herein and constitute a part of this specification. The drawings illustrate embodiments of the application and, together with the description, serve to illustrate the principles of the application.

DETAILED DESCRIPTION OF THE PREFERRED EMBODIMENTS

Figure 1A:
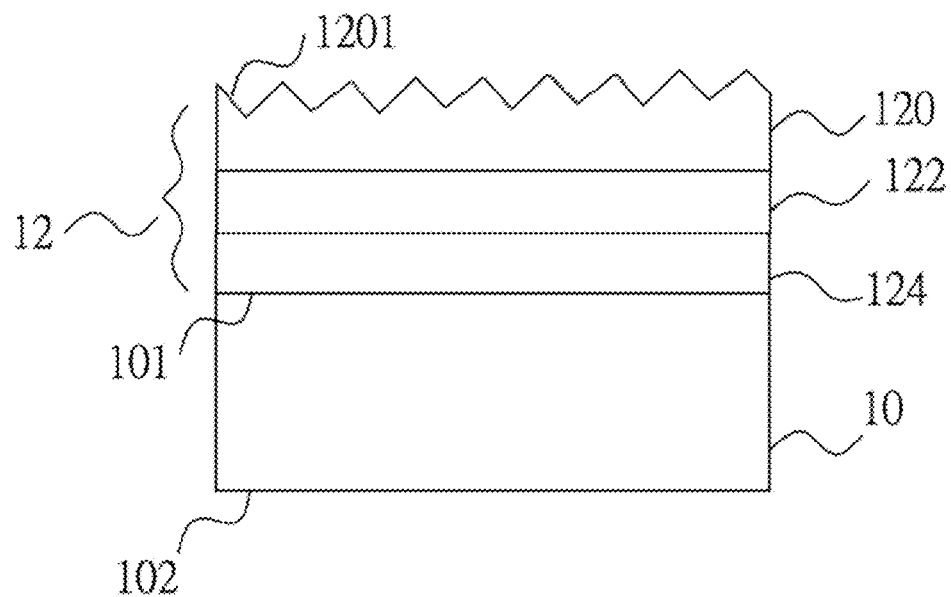
FIG. 1A-FIG. 1F illustrate a process flow of a method of fabricating a light emitting device in accordance with a first embodiment of the present application.

Reference is made in detail to the preferred embodiments of the present application, examples of which are illustrated in the accompanying drawings. Wherever possible, the same reference numbers are used in the drawings and the description to refer to the same or like parts.

The present disclosure describes a light emitting device and a method of fabricating the light emitting device. In order to have a thorough understanding of the present disclosure, please refer to the following description and the illustrations of FIG. 1A to FIG. 7.

FIGS. 1A to 1F illustrate a process flow of the method of fabricating a light emitting device in accordance with a first embodiment of the present application. Referring to FIG. 1A, a light-emitting device comprises a conductive substrate 10; a light emitting stack 12 including a first conductivity type semiconductor layer 124, a light-emitting layer 122 and a second conductivity type semiconductor layer 120 sequentially formed on the first surface 101 of the conductive substrate wherein the upper surface 1201 of the second conductivity type semiconductor layer 120 has a textured surface formed by an epitaxy method, an etching method, or the combination thereof. The material of the light emitting stack 12 contains one or more elements selected from the group consisting of Ga, Al, In, As, P, N and Si, such as aluminum gallium indium phosphide (AlGaInP) series material, aluminum gallium indium nitride (AlGaInN) series material and so on. The light-emitting layer 122 can be a single heterostructure (SH), a double heterostructure (DH), a double-side double heterostructure (DDH), or a multi-quantum well (MWQ). Besides, the wavelength of the emitting light can also be adjusted by changing the number of the pairs of the quantum well.

Figure 1B:
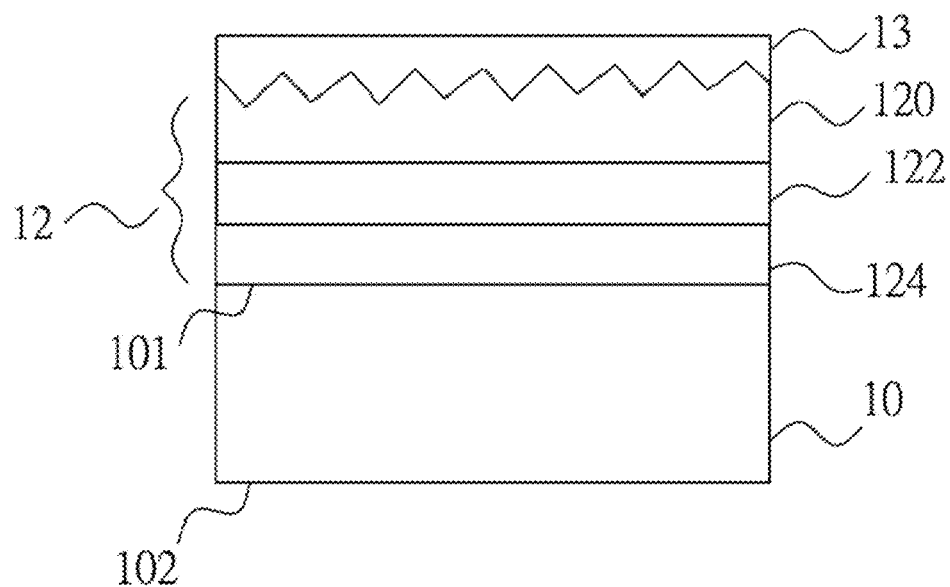

Referring to FIG. 1B, a first planarization layer 13 is formed to cover and fill the textured spaces of the upper surface 1201 of the second conductivity type semiconductor layer 120. The first planarization layer 13 can be formed by spin coating method such as spin-on glass (SOG) or benzocyclobutene (BCB). In one embodiment of this application, the SOG can be a dielectric material mixture of $SiO_2$ and dopants (either boron or phosphorous) that is suspended in a solvent solution. The SOG can also be polymers such as HSQ (Hydrogen silesquioxane) or MSQ (Methylsequioxane).

Figure 1C:
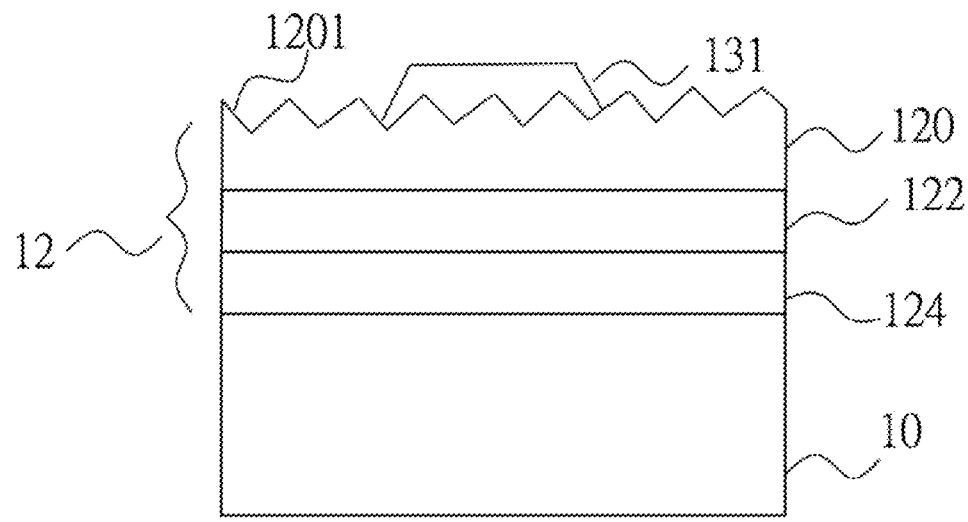

Referring to FIG. 1C, the first planarization layer 13 is patterned and solidified to form a second planarization layer 131 by etching or lithography method wherein part of the upper surface 1201 of the second conductivity type semiconductor layer 120 is exposed and not covered by the second planarization layer 131. The position of the second planarization layer 131 is not specified and can be formed in the middle or the edge of the second conductivity type semiconductor layer 120.

Figure 1D:
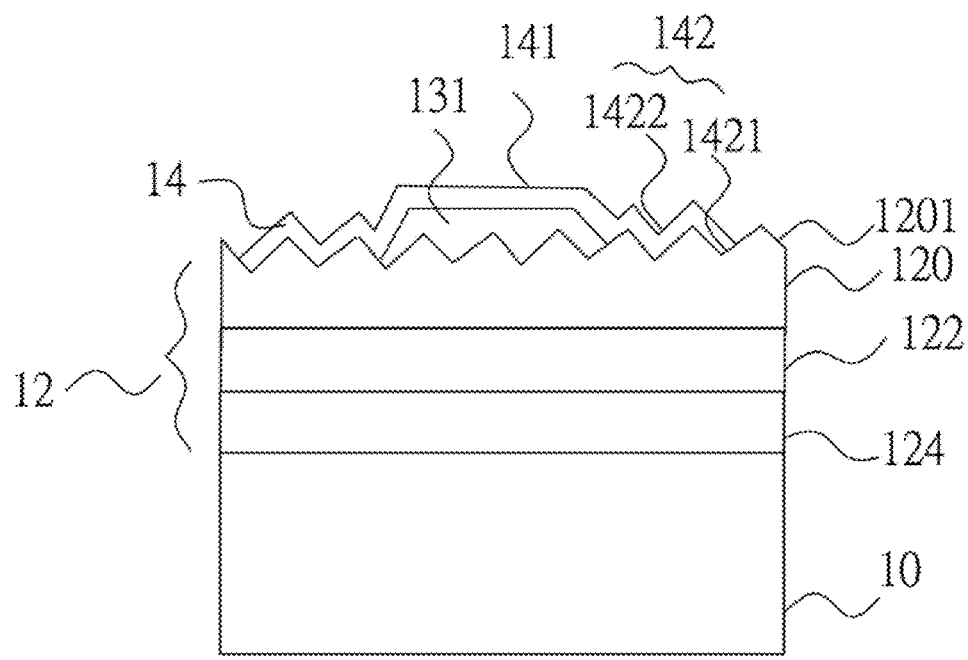

Referring to FIG. 1D, a first transparent conductive oxide layer 14 is formed to cover the entire second planarization layer 131 and part of the upper surface second conductivity type semiconductor layer 1201. The first transparent conductive oxide layer 14 includes a first portion 141 and a second portion 142, wherein the first portion 141 is formed in contact with the entire second planarization layer 131 which is substantially flat, and the second portion 142 is formed on the upper surface of the second conductivity type semiconductor layer 1201 having a first plurality of cavities 1421 in contact with the upper surface of the second conductivity type semiconductor layer 1201 and a second plurality of cavities 1422 formed in the upper surface of the second portion 142 which is opposite to the first plurality of cavities 1421. The first plurality of cavities 1421 are shaped into cones or pyramids (as shown in FIGS. 1G-1H) and formed by an epitaxy method, an etching method, or the combination thereof. The second plurality of cavities 1422 are shaped into a cone or a pyramid by an etching process and extended downwards to the first plurality of cavities 1421 of the first transparent conductive layer 14, wherein the direction of the extension is preferably perpendicular to the top surface of the conductive substrate 10.

Figure 1E:
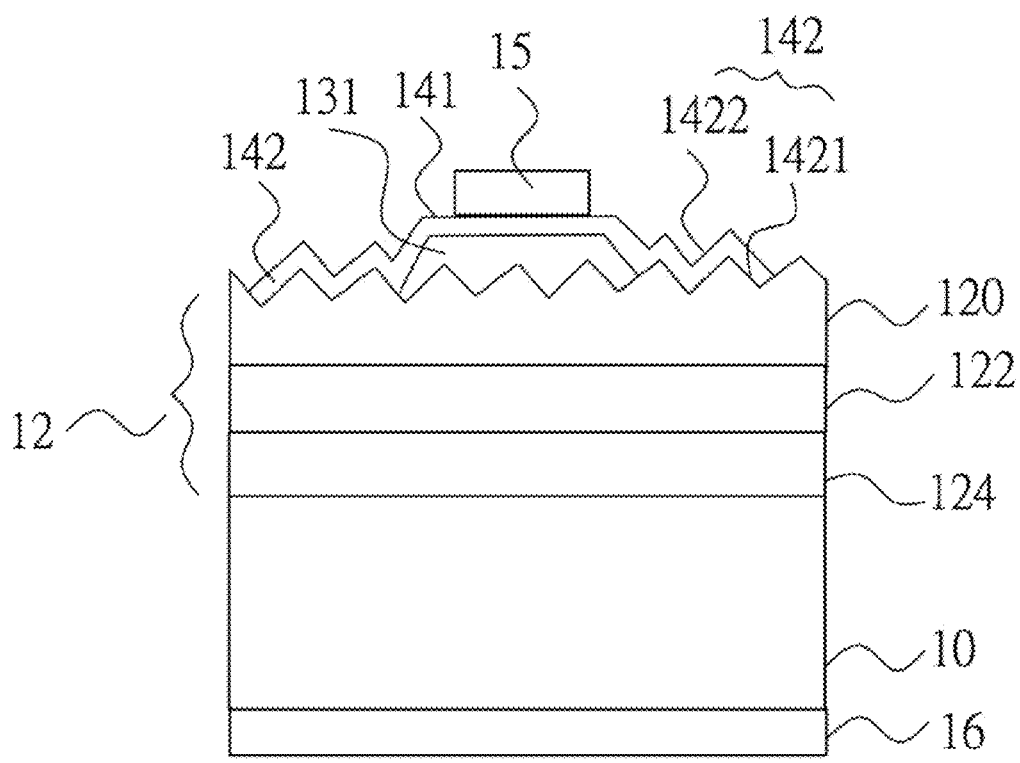

Referring to FIG. 1E, a first electrode 15 is formed on the first portion 141 of the first transparent conductive oxide layer 14; and a second electrode 16 is formed on the second surface 102 of the conductive substrate 10. The material of the electrode structure mentioned above can be metal material such as Cr, Ti, Ni, Pt, Cu, Au, Al, or Ag.

Figure 1F:
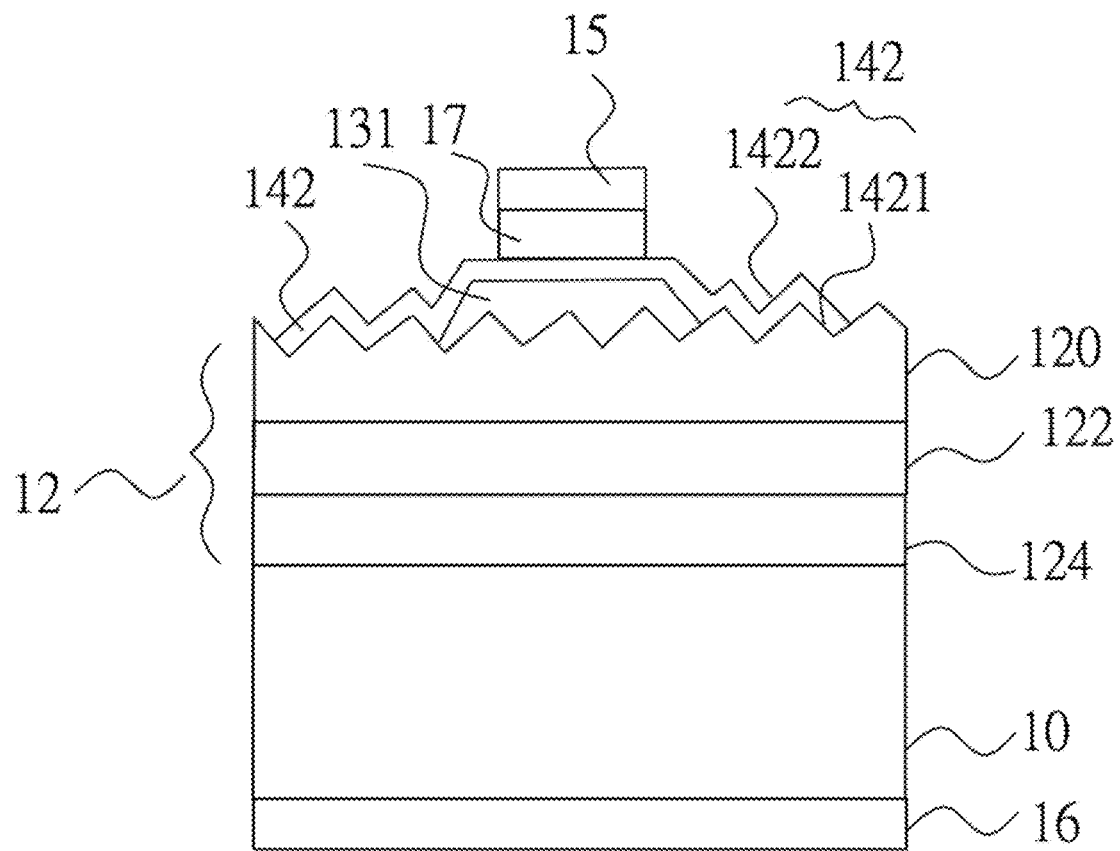
Figure 1G:
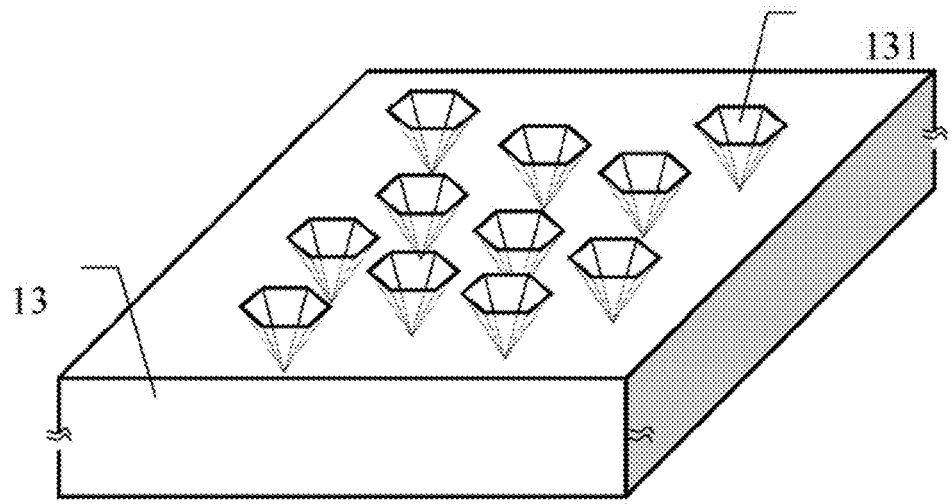
FIG. 1G is a top view of a second semiconductor layer in accordance with a first embodiment of the present application.
Figure 1H:
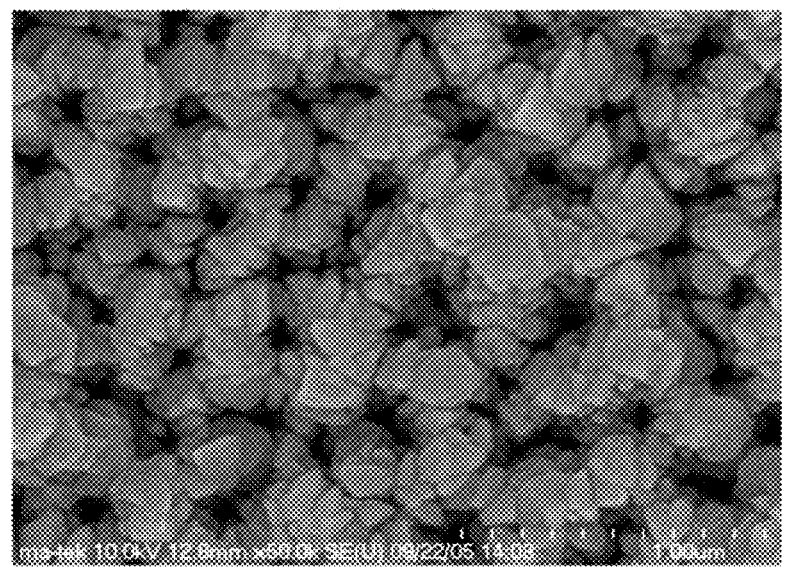
FIG. 1H is an SEM diagram showing a surface morphology of an ITO layer in accordance with a first embodiment of the present application.

Referring to FIG. 1F, in another embodiment of this application, a first reflective metal layer 17 can be formed on the first portion 141 of the first transparent conductive oxide layer 14; a first electrode 15 can be formed on the first reflective metal layer 17 to improve the light-emitting efficiency.

In accordance with the first embodiment of the present application, by forming the second planarization layer 131 the part of the transparent conductive oxide layer 14, the first electrode 15 and the first reflective metal layer 17 can be formed on a substantially flat surface, and the impedance and the forward voltage can be decreased and the lateral current conduction, current spreading and efficiency can be increased.

Besides, the first plurality of cavities 1421 are extended downwards from the surface of the second semiconductor layer 120 and make the upper surface of the second portion 142 of the first transparent conductive oxide layer 14 conformally formed on the second semiconductor layer 120 and have the second plurality of cavities 1422. The adhesion strength between the first reflective metal layer 17 and the first transparent conductive oxide layer 14 has been improved by the first plurality of cavities 1421. The result of a peeling test for the device made in accordance with the first embodiment and the conventional LED device without cavities on the surface of the first transparent oxide layer shows that all the devices in accordance with the first embodiment passed the peeling test, but more than 80% of the conventional LED devices failed in the peeling test. By the combination of the flat and textured first transparent oxide layer, the lower efficiency and peeling issues are solved.

Figure 2A:
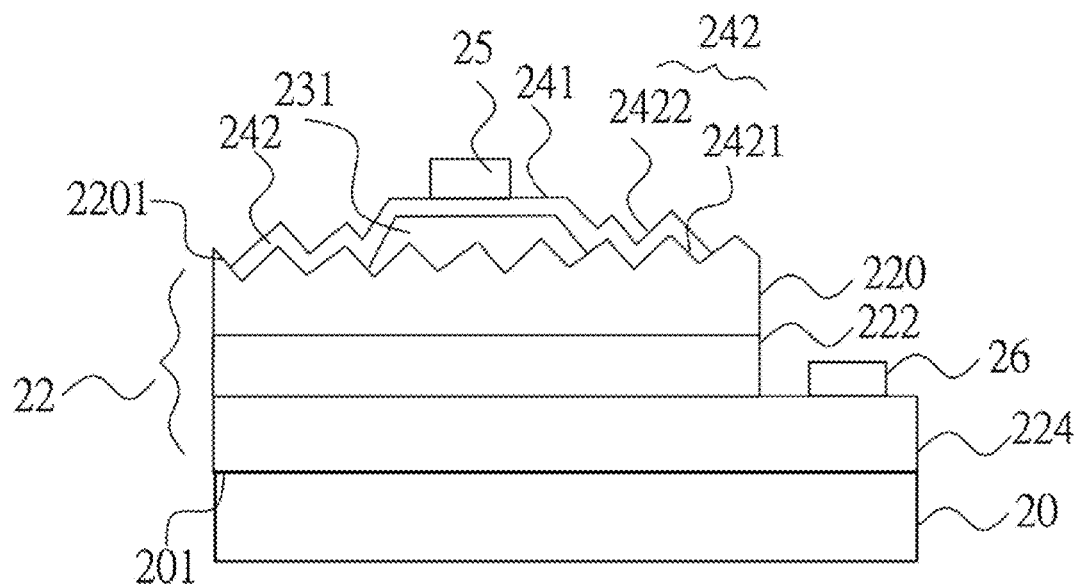
FIGS. 2A-2D are cross-sectional views of a light-emitting device in accordance with a horizontal type embodiment of the present application.

FIGS. 2A-2D are cross-sectional views of a light-emitting device in accordance with a horizontal type embodiment of the present application. Referring to FIG. 2A, a light-emitting device comprises a substrate 20; a light emitting stack 22 including a first conductivity type semiconductor layer 224, a light-emitting layer 222 and a second conductivity type semiconductor layer 220 sequentially formed on the first surface 201 of the substrate 20 wherein the upper surface 2201 of the second conductivity type semiconductor layer 220 has a textured surface formed by an epitaxy method, an etching method, or the combination thereof. The light emitting stack 22 is etched, and part of the first conductivity type semiconductor layer 224 is exposed to form a horizontal type light emitting device.

The material of the light emitting stack 22 contains one or more elements selected from the group consisting of Ga, Al, In, As, P, N and Si, such as aluminum gallium indium phosphide (AlGaInP) series material, aluminum gallium indium nitride (AlGaInN) series material and so on. The light-emitting layer 222 can be a single heterostructure (SH), a double heterostructure (DH), a double-side double heterostructure (DDH), or a multi-quantum well (MWQ). Besides, the wavelength of the emitting light can also be adjusted by changing the number of the pairs of the quantum well.

Following a similar process as the first embodiment, a first planarization layer (not shown) is formed by spin coating method such as spin-on glass (SOG) or benzocyclobutene (BCB) to cover and fill the textured spaces of the upper surface 2201 of the second conductivity type semiconductor layer 220. The first planarization layer 23 can be formed by spin coating method such as spin-on glass (SOG) or benzocyclobutene (BCB). In one embodiment of this application, the SOG can be a dielectric material mixture of $SiO_2$ and dopants (either boron or phosphorous) that is suspended in a solvent solution. The SOG can also be polymers such as HSQ (Hydrogen silesquioxane) or MSQ (Methylsequioxane).

Then, the first planarization layer (not shown) is patterned and solidified to form a second planarization layer 231 by etching or lithography method wherein part of the upper surface 2201 of the second conductivity type semiconductor layer 220 is exposed and not covered by the second planarization layer 231. The position of the second planarization layer 231 is not specified and can be formed in the middle or the edge of the second conductivity type semiconductor layer 220.

Following, a first transparent conductive oxide layer 24 is formed to cover the entire second planarization layer 231 and part of the upper surface second conductivity type semiconductor layer 2201. The first transparent conductive oxide layer 24 includes a first portion 241 and a second portion 242, wherein the first portion 241 is formed in contact with the entire second planarization layer 231 which is substantially flat, and the second portion 242 is formed on the upper surface of the second conductivity type semiconductor layer 2201 having a first plurality of cavities 2421 in contact with the upper surface of the second conductivity type semiconductor layer 2201 and a second plurality of cavities 2422 formed in the upper surface of the second portion 242 which is opposite to the first plurality of cavities 2421. The first plurality of cavities 2421 are shaped into cones or pyramids and formed by an epitaxy method, an etching method, or the combination thereof. The second plurality of cavities 2422 are shaped into a cone or a pyramid by an etching process and extended downwards to the first plurality of cavities 2421 of the first transparent conductive layer 24, wherein the direction of the extension is preferably perpendicular to the top surface of the substrate 20.

Finally, a first electrode 25 is formed on the first portion 241 of the first transparent conductive oxide layer 24; and a second electrode 26 is formed on the exposed first conductivity type semiconductor layer 224. The material of the electrode structure mentioned above can be metal material such as Cr, Ti, Ni, Pt, Cu, Au, Al, Ag, or the alloy thereof. By the combination of the flat and textured first transparent oxide layer, the lower efficiency issues are solved.

Figure 2B:
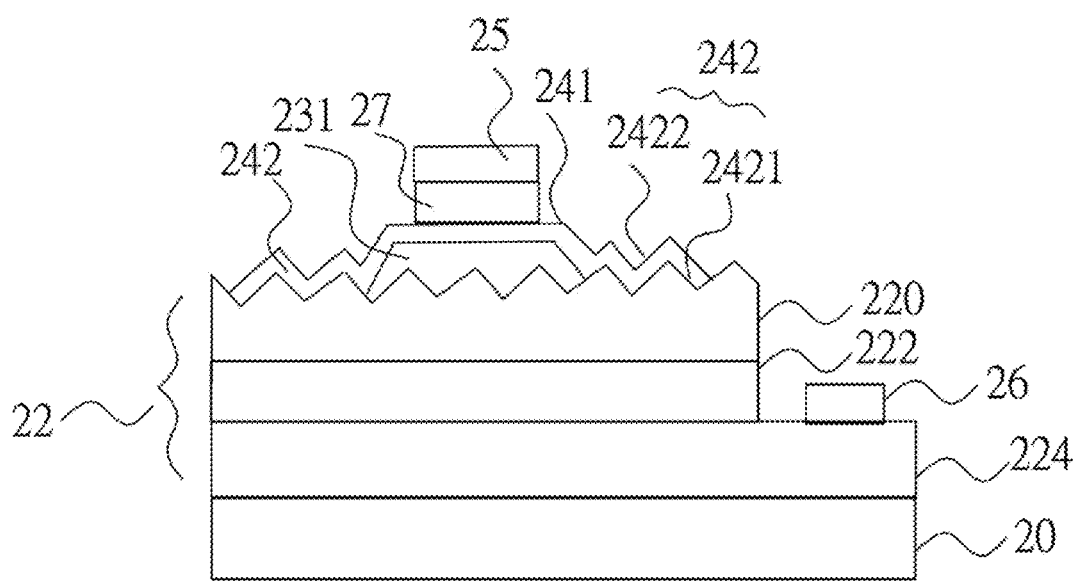

Referring to FIG. 2B, In another embodiment of this application, a first reflective metal layer 27 can be formed on the first portion 241 of the first transparent conductive oxide layer 24; a first electrode 25 can be formed on the first reflective metal layer 27 to improve the light-emitting efficiency.

The first plurality of cavities 2421 are extended downwards from the surface of the second semiconductor layer 220 and make the upper surface of the second portion 242 of the first transparent conductive oxide layer 24 conformally formed on the second semiconductor layer 220 and have the second plurality of cavities 2422. The adhesion strength between the first reflective metal layer 27 and the first transparent conductive oxide layer 24 has been improved by the first plurality of cavities 2421. The result of a peeling test for the device made in accordance with the first embodiment and the conventional LED device without cavities on the surface of the first transparent oxide layer shows that all the devices in accordance with the first embodiment passed the peeling test, but more than 80% of the conventional LED devices failed in the peeling test. By the combination of the flat and textured first transparent oxide layer, the lower efficiency and peeling issues are solved.

Figure 2C:
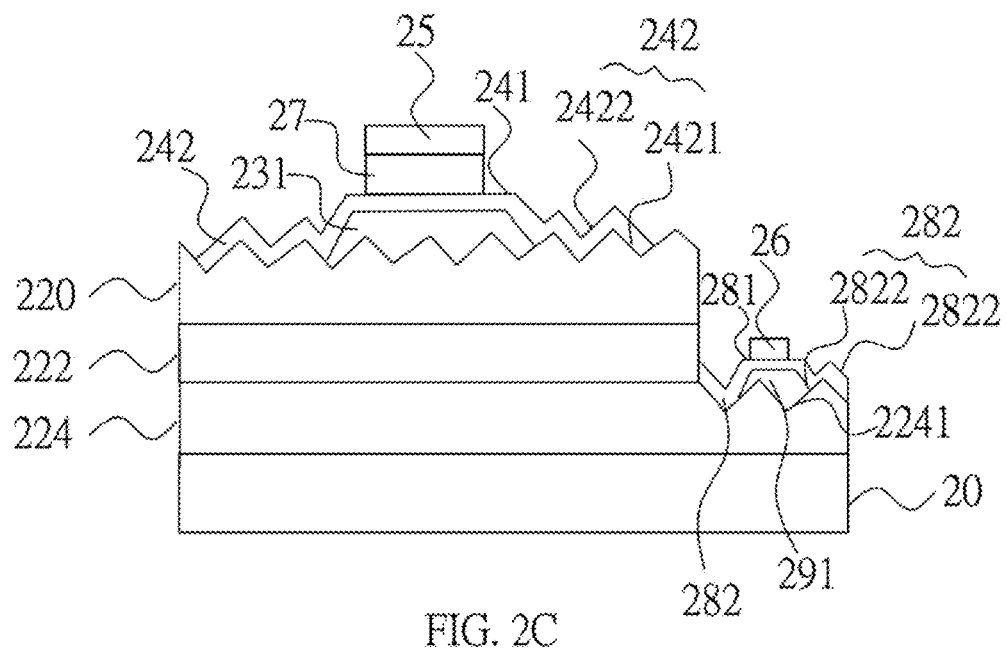

Referring to FIG. 2C, in another embodiment of this application, the difference between the FIG. 2A and FIG. 2C is that the first conductivity type semiconductor layer 224 is etched to form a textured surface 2241. Following, a similar process as the embodiment in FIG. 2A, a third planarization layer (not shown) is formed by spin coating method such as spin-on glass (SOG) or benzocyclobutene (BCB) to cover and fill the textured spaces of the upper surface 2241 of the first conductivity type semiconductor layer 220 and then the third planarization layer (not shown) is patterned and solidified to form a fourth planarization layer 291 by etching or lithography method wherein part of the upper surface 2241 of the first conductivity type semiconductor layer 224 is exposed. The position of the fourth planarization layer 291 is not specified and can be formed in the middle or the edge of the second conductivity type semiconductor layer 224.

Following, a second transparent conductive oxide layer 28 is formed to cover the entire fourth planarization layer 291 and part of the upper surface first conductivity type semiconductor layer 2241. The second transparent conductive oxide layer 28 includes a first portion 281 and a second portion 282 wherein the first portion 281 is formed in contact with the entire fourth planarization layer 291 which is substantially flat and the second portion 282 is formed on the upper surface of the first conductivity type semiconductor layer 2241 having a first plurality of cavities 2821 in contact with the upper surface of the first conductivity type semiconductor layer 2241 and a second plurality of cavities 2822 formed in the upper surface of the second portion 282 which is opposite to the first plurality of cavities 2821. The first plurality of cavities 2821 are shaped into cones or pyramids and formed by an epitaxy method, an etching method, or the combination thereof. The second plurality of cavities 2822 are shaped into a cone or a pyramid by an etching process and extended downwards to the first plurality of cavities 2821 of the second transparent conductive layer 28, wherein the direction of the extension is preferably perpendicular to the top surface of the substrate 20.

Finally, a first electrode 25 is formed on the first portion 241 of the first transparent conductive oxide layer 24; and a second electrode 26 is formed on the first portion 281 of the second transparent conductive oxide layer 28. The material of the electrode structure mentioned above can be metal material such as Cr, Ti, Ni, Pt, Cu, Au, Al, or Ag. By the combination of the flat and textured first transparent oxide layer and the flat and textured second transparent oxide layer, the lower efficiency issues are solved.

Figure 2D:
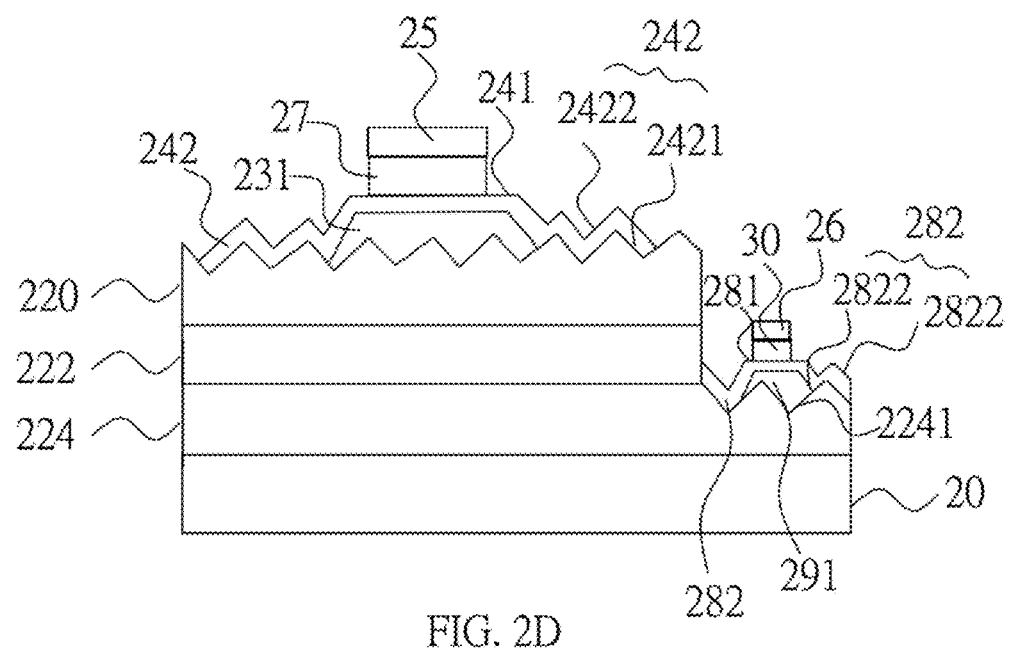

Referring to FIG. 2D, in another embodiment of this application, a second reflective metal layer 30 can be formed on the first portion 281 of the second transparent conductive oxide layer 28; a first electrode 25 can be formed on the first reflective metal layer 27 and a second electrode 26 can be formed on the second reflective layer 30 to improve the light-emitting efficiency.

Figure 3:
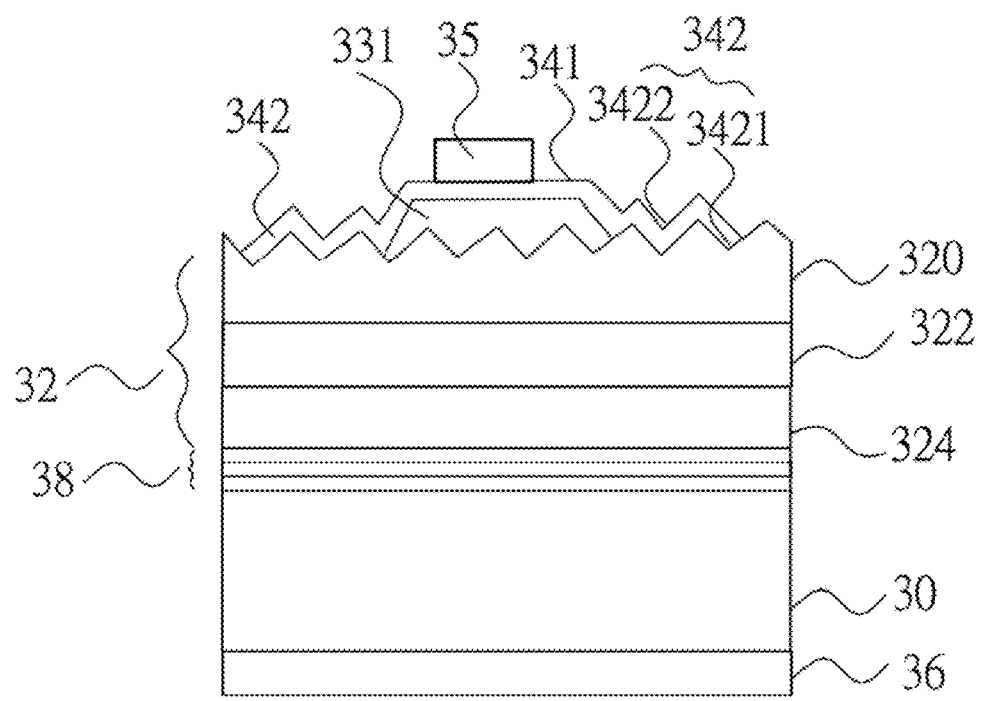
FIG. 3 is a cross-sectional view of a light-emitting device in accordance with a third embodiment of the present application.

FIG. 3 is a cross-sectional view of a light-emitting device in accordance with a third embodiment of the present application. The difference between the third embodiment and the first embodiment is that an additional Distributed Bragg Reflector (DBR) layer 38 is formed between the conductive substrate 30 and the first conductivity type semiconductor layer 324.

Figure 4:
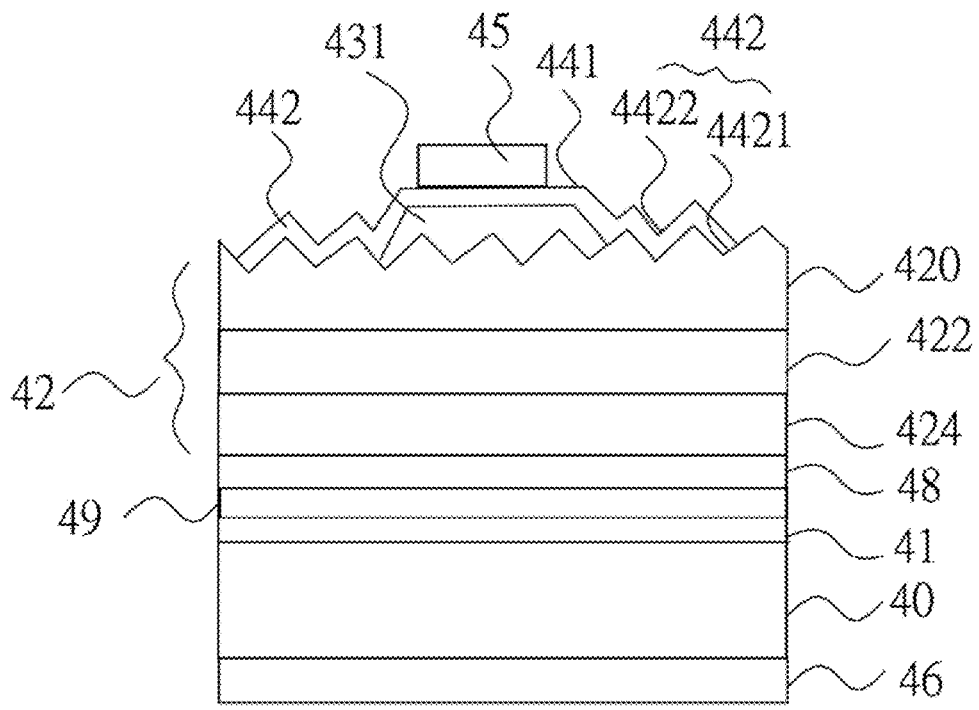
FIG. 4 is a cross-sectional view of a light-emitting device in accordance with a fourth embodiment of the present application.

FIG. 4 is a cross-sectional view of a light-emitting device in accordance with a fourth embodiment of the application. The difference between the fourth embodiment and the first embodiment is that a metal bonding layer 41, a reflective layer 49 and a second transparent conductive oxide layer 48 is formed between the conductive substrate 40 and the first conductivity type semiconductor layer 424.

Figure 5:
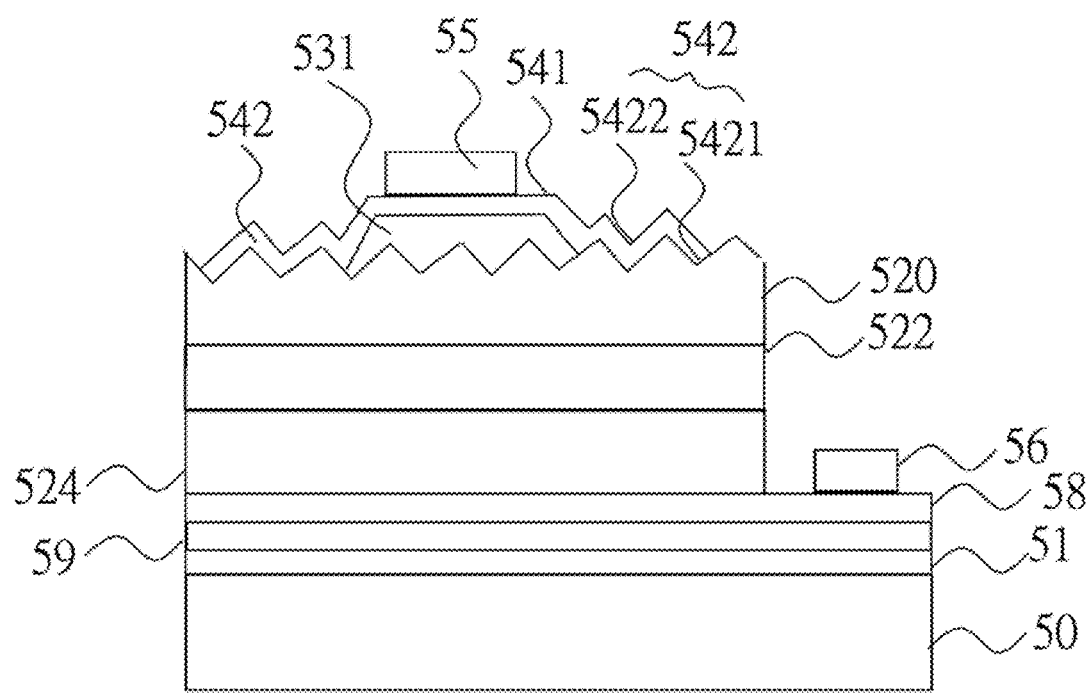
FIG. 5 is a cross-sectional view of a light-emitting device in accordance with a fifth embodiment of the present application.

FIG. 5 is a cross-sectional view of a light-emitting device in accordance with a fifth embodiment of the present application. The difference between the fourth embodiment and the second embodiment is that a metal bonding layer 51, a reflective layer 59 and a second transparent conductive oxide layer 58 is formed between the substrate 50 and the first conductivity type semiconductor layer 524 and the second electrode 56 is formed on the second transparent conductive oxide layer 58.

Figure 6A:
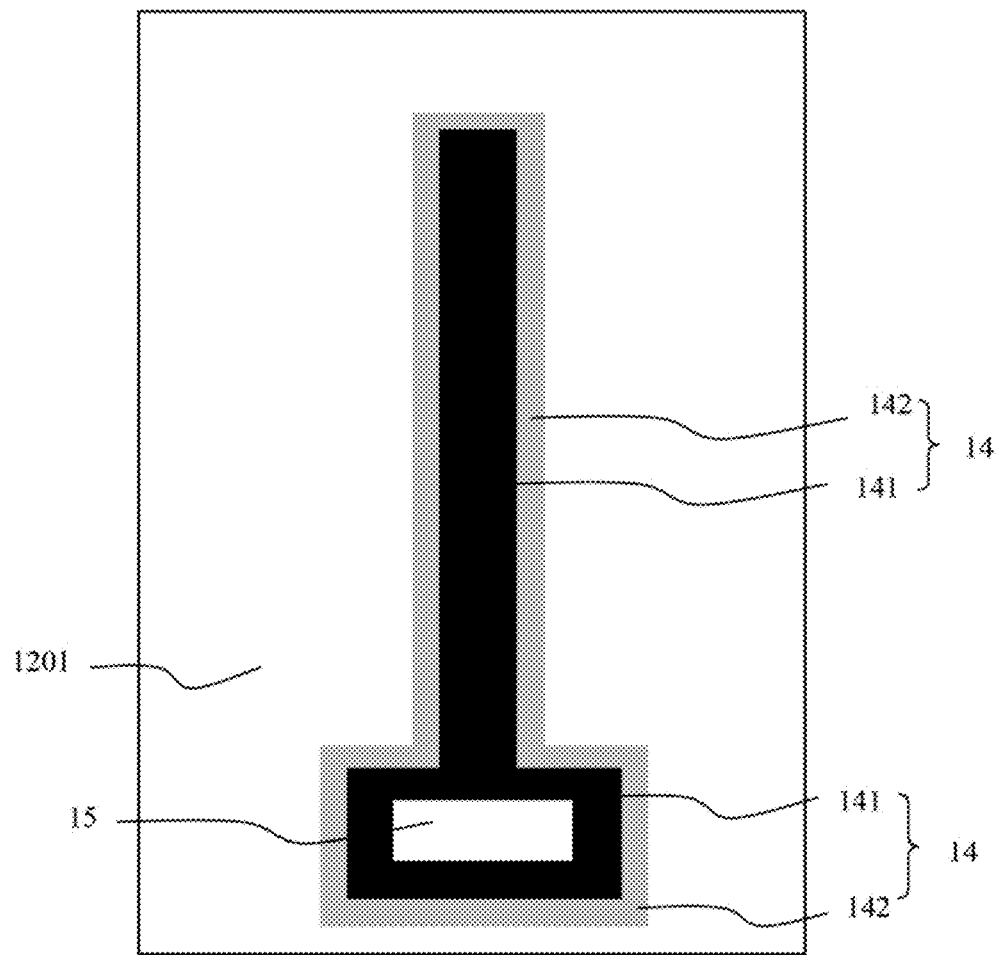
FIGS. 6A-6B are top views of a second semiconductor layer in accordance with a first embodiment of the present application.
Figure 6B:
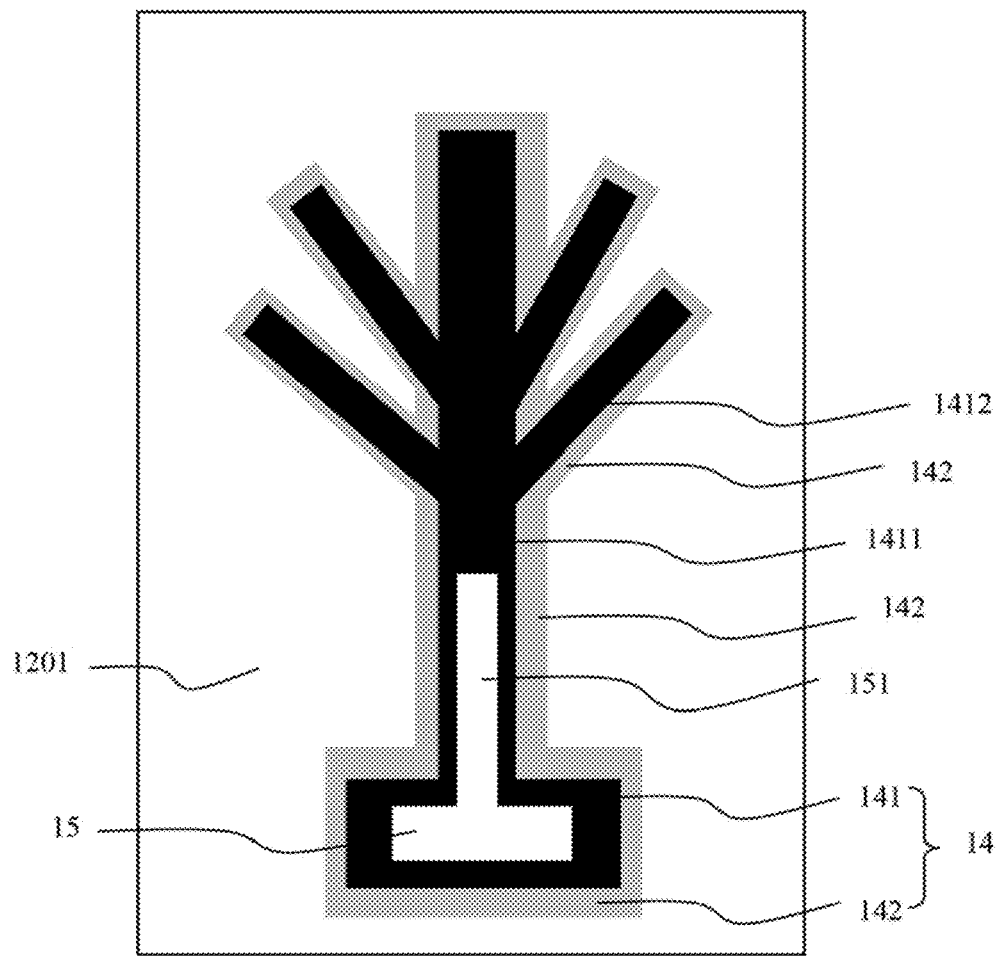

FIGS. 6A-6B are top views of a second semiconductor layer in accordance with a first embodiment of the present application. FIG. 6A is a top view of a second semiconductor layer 120, the second planarization layer (not shown) can be formed on part of the second semiconductor layer 120. After forming the second planarization layer, the first transparent conductive oxide layer 14 is formed on part of the second planarization layer and having a first portion 141 in contact with the entire second planarization layer which is substantially flat and a second portion formed on the second semiconductor layer 120 with a textured surface. Following, a first electrode 15 is formed on the first portion 141 of the first transparent conductive oxide layer 14. In this embodiment, part of the first transparent conductive oxide layer 14 is not covered by the first electrode 15 and is extended toward the other end of the light emitting chip as a finger to spread the current.

Referring to FIG. 6B, in another embodiment, the first electrode 15 can have a secondary branch 151 having a finger-like pattern extended toward the other end of the light emitting device to have better current spreading. The first transparent conductive oxide layer 14 can further have a secondary branch 1411 having a finger-like pattern extended toward the other end of the light emitting device and a third class branch 1412 extended from the secondary branch 1411 as a transparent finger to increase the current spreading efficiency. In this embodiment, part of the secondary branch 1411 and the third class branch 1412 of the first transparent conductive oxide layer is not covered by the secondary branch of the first electrode 151. Since the secondary branch of the first transparent conductive oxide layer 1411 and the third class branch 1412 of the first transparent conductive oxide layer is formed on the second planarization layer (not shown), the structure is also substantially flat and can have a better current spreading efficiency.

Figure 7A:
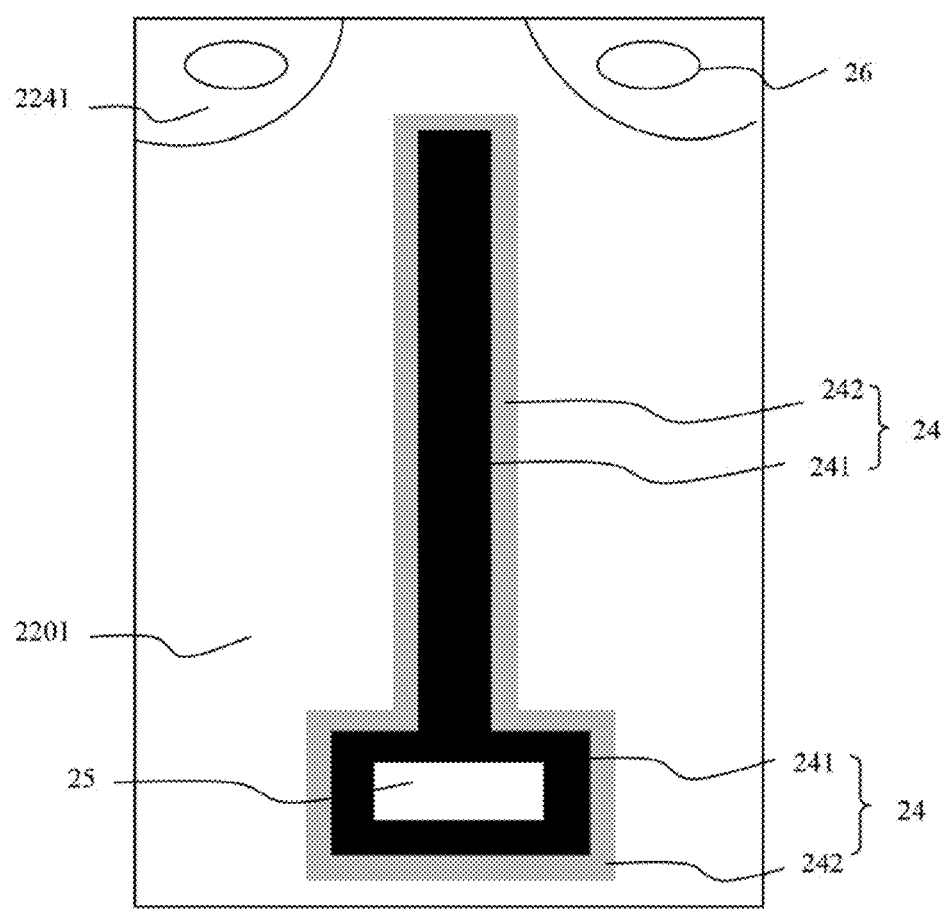
FIGS. 7A-7B are top views second semiconductor layer in accordance with a second embodiment of the present application.
Figure 7B:
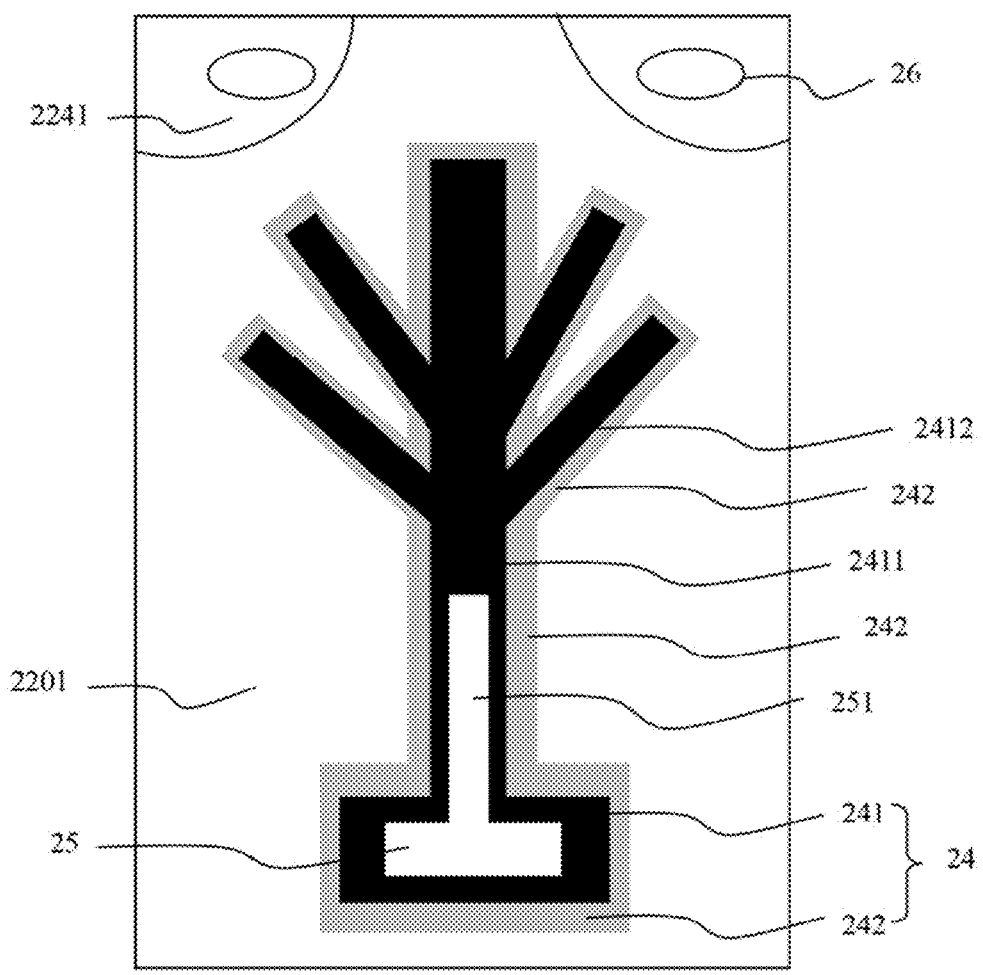

FIGS. 7A-7B are top views of a second semiconductor layer in accordance with a first embodiment of the present application. FIG. 7A is a top view of a second semiconductor layer 220, the second planarization layer (not shown) can be formed on part of the second semiconductor layer 220. After forming the second planarization layer, the first transparent conductive oxide layer 24 is formed on part of the second planarization layer and having a first portion 241 in contact with the entire second planarization layer which is substantially flat and a second portion formed on the second semiconductor layer 220 with a textured surface. Following, a first electrode 25 is formed on the first portion 241 of the first transparent conductive oxide layer 24. In this embodiment, part of the first transparent conductive oxide layer 24 is not covered by the first electrode 25 and is extended toward the other end of the light emitting chip as a finger to spread the current.

Referring to FIG. 7B, in another embodiment, the first electrode 25 can have a secondary branch 251 having a finger-like pattern extended toward the other end of the light emitting device to have better current spreading. The first transparent conductive oxide layer 24 can further have a secondary branch 2411 having a finger-like pattern extended toward the other end of the light emitting device and a third class branch 2412 extended from the secondary branch 2411 as a transparent finger to increase the current spreading efficiency. In this embodiment, part of the secondary branch 2411 and the third class branch 2412 of the first transparent conductive oxide layer is not covered by the secondary branch of the first electrode 251. Since the secondary branch of the first transparent conductive oxide layer 2411 and the third class branch 2412 of the first transparent conductive oxide layer is formed on the second planarization layer (not shown), the structure is also substantially flat and can have a better current spreading efficiency.

Figure 8A:
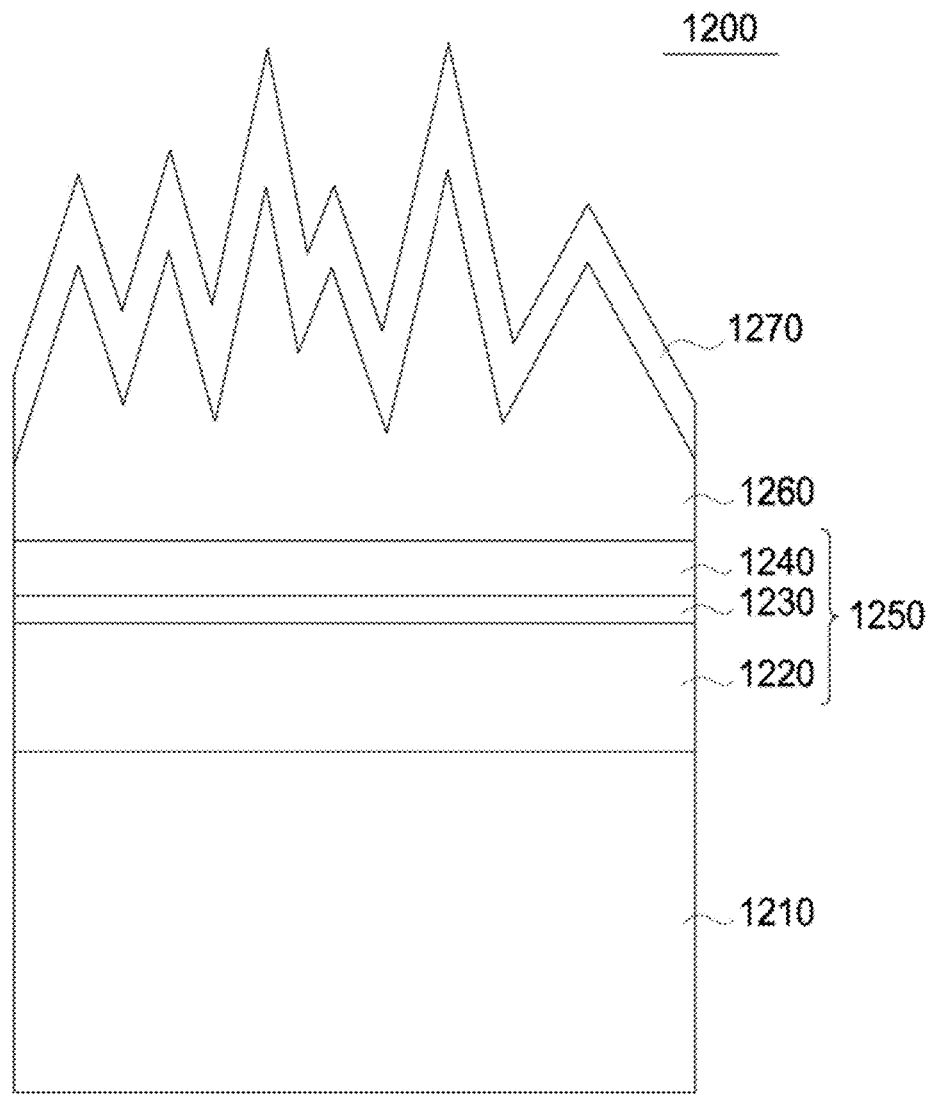
FIGS. 8A-8C are cross-sectional views of a light emitting device in accordance with a third embodiment of the present application.
Figure 8B:
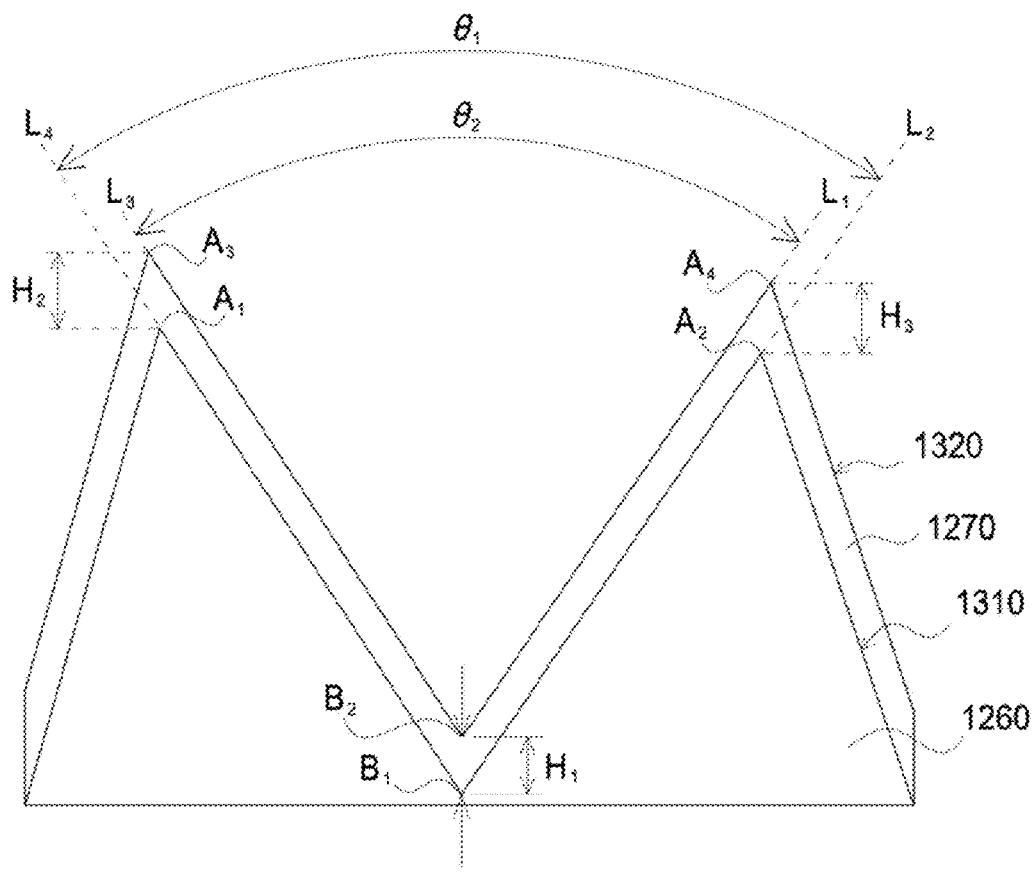
Figure 8C:
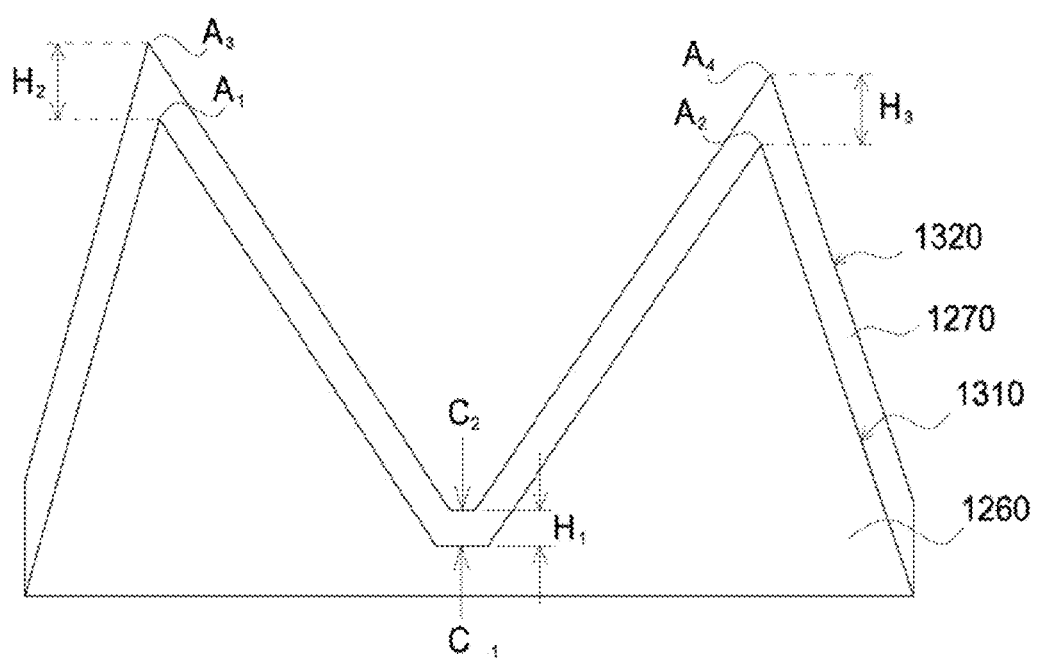

FIGS. 8A-8C are cross-sectional views of a light emitting device 1200 in accordance with a third embodiment of the present application. FIG. 8A illustrates a substrate 1210, a light-emitting structure 1250 formed on the substrate 1210, a semiconductor contact layer 1260 having a rough top surface formed on the light-emitting structure 1250, and a transparent current spreading layer 1270 having a top surface formed on the semiconductor contact layer 1260. The light-emitting structure 1250 includes a first conductivity type semiconductor layer 1220, an active layer 1230, and a second conductivity type semiconductor layer 1240. The rough top surface of the semiconductor contact layer 1260 is substantially directly under the top surface of the transparent current spreading layer 1270. The substrate 1210 is a growth base or a carrier base. The material of the semiconductor contact layer 1260 and the light-emitting structure 1250 comprise one or more elements selected from a group consisting of gallium, aluminum, indium, arsenic, phosphorous, nitrogen, and silicon. The transparent current spreading layer 1270 comprises a metal oxide or a metal nitride.

Following, FIG. 8B illustrates an enlarged diagram of a partial region of the semiconductor contact layer 1260 and of the transparent current spreading layer 1270. The rough top surface 1310 of the semiconductor contact layer 1260 comprises any two adjacent crests having a highest point $A_1$, $A_2$ respectively and a trough having a lowest point $B_1$ between the two adjacent crests. The top surface 1320 of the transparent current spreading layer 1270 comprises any two adjacent crests having a highest point $A_3$, $A_4$ respectively and a trough having a lowest point $B_2$ between the two adjacent crests. Two oblique lines $L_2$, $L_4$ are formed by connecting the highest points $A_1$, $A_2$ and the lowest point $B_1$ of the rough top surface 1310 on the semiconductor contact layer 1260. A first angle $\theta_1$ is formed between the two oblique lines $L_2$, $L_4$. Two oblique lines $L_1$, $L_3$ are formed by connecting the highest points $A_3$, $A_4$ and the lowest point $B_2$ of the top surface 1320 on the transparent current spreading layer 1270. A second angle $\theta_2$ is formed between the two oblique lines $L_1$, $L_3$. A difference between the first angle $\theta_1$ and the second angle $\theta_2$ is greater than 10 degrees. In another embodiment, the first angle $\theta_1$ is substantially the same as the second angle $\theta_2$. A height difference $H_1$ between the lowest point $B_2$ on the trough of the top surface 1320 of the transparent current spreading layer 1270 and the lowest point $B_1$ on the trough of the rough top surface 1310 of the semiconductor contact layer 1260 is greater than 0. A height difference $H_2$ between the highest point $A_3$ on the crest of the top surface 1320 of the transparent current spreading layer 1270 and the highest point $A_1$ on the crest of the rough top surface 1310 of the semiconductor contact layer 1260 is greater than 0. A height difference $H_3$ between the highest point $A_4$ on the crest of the top surface 1320 of the transparent current spreading layer 1270 and the highest point $A_2$ on the crest of the rough top surface 1310 of the semiconductor contact layer 1260 is greater than 0. The height difference $H_2$ is the same as or different from the height difference $H_3$. A ratio of the height difference $H_1$ and the height difference $H_2$ is between 0.1 and 10. A ratio of the height difference $H_1$ and the height difference $H_3$ is between 0.1 and 10. In another embodiment, the rough top surface 1310 of the semiconductor contact layer 1260 comprises a cavity shaped as cone or pyramid, wherein the cavity extends from the rough top surface 1310 of the semiconductor contact layer 1260 downwards to inner of the semiconductor contact layer 1260.

FIG. 8C illustrates another enlarged diagram of a partial region of the semiconductor contact layer 1260 and of the transparent current spreading layer 1270. A flat region $C_1$ is on the trough of the rough top surface 1310 of the semiconductor contact layer 1260. A flat region $C_2$ is on the trough of the top surface 1320 of the transparent current spreading layer 1270. A height difference $H_1$ between the flat region $C_2$ on the trough of the top surface 1320 of the transparent current spreading layer 1270 and the flat region C₁ on the trough of the rough top surface 1310 of the semiconductor contact layer 1260 is greater than 0.

Figure 9A:
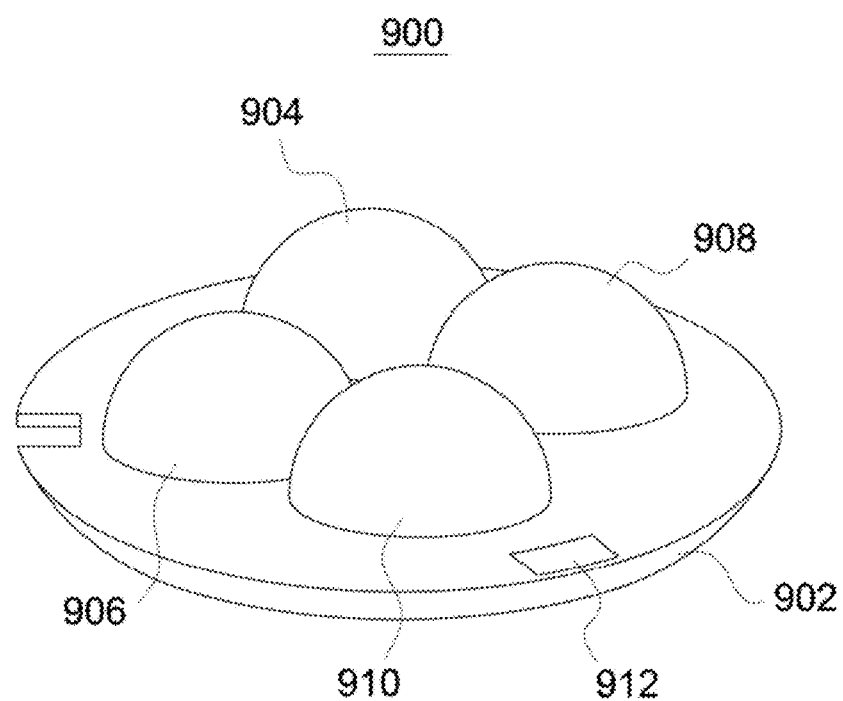
FIGS. 9A to 9C illustrates an LED module of an embodiment in the present disclosure.
Figure 9B:
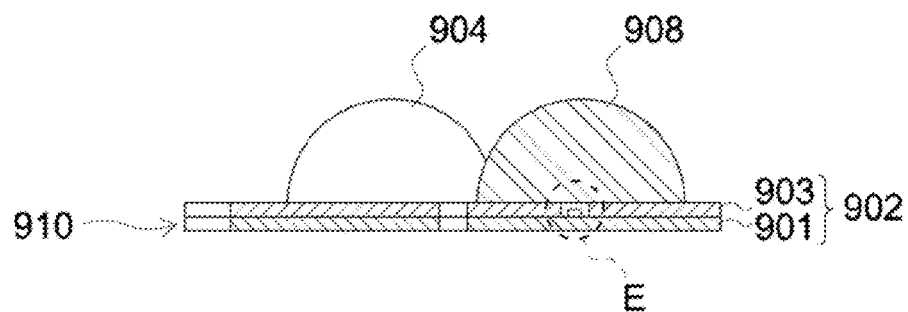
Figure 9C:
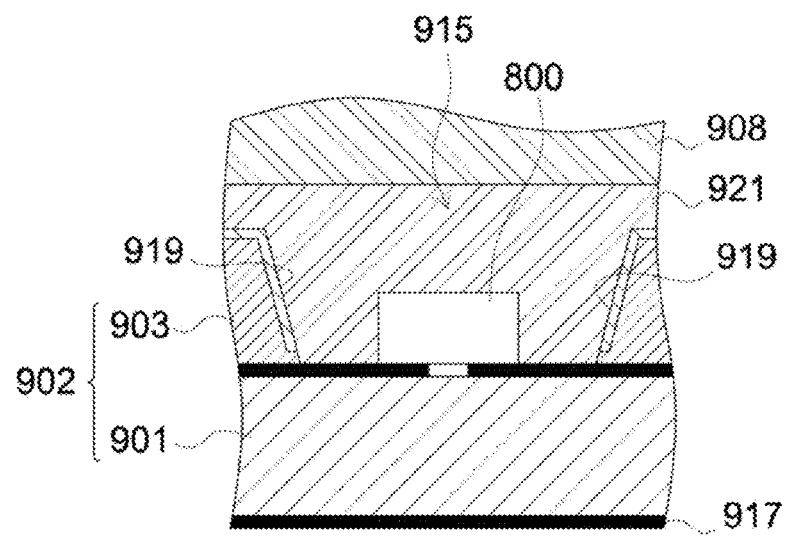

FIGS. 9A-9C illustrates an LED module of an application in the present disclosure. FIG. 9A is an external perspective view illustrating an optoelectronic device module 900 including a submount 902, an optoelectronic device (not illustrated) described above, a plurality of lens 904, 906, 908, 910, and two power supply terminals 912, 914. The optoelectronic device module 900 is attached to a lighting unit 1000 (mentioned later).

FIG. 9B is a plan view illustrating the optoelectronic device module 900, and FIG. 9C is an enlarged view illustrating a portion E illustrated in FIG. 9B. As FIG. 9B illustrates, the submount 902 including an upper subunit 903 and a lower subunit 901, and at least one surface of the lower subunit 901 is contacted with the upper subunit 903. The lens 904, 908 are formed on the upper subunit 903. At least one through hole 915 is formed on the upper subunit 903 and at least one of the optoelectronic device 800 is formed inside the through hole 915 and contacted with the lower subunit 901. Besides, the optoelectronic device 800 is encapsulated by an encapsulating material 921 and a lens 908 is formed on the encapsulating material 921 wherein the material of the encapsulating material 921 may be a silicone resin, an epoxy resin or the like. In one embodiment, a reflecting layer 919 is formed on the sidewall of the through hole 915 to increase the light emitting efficiency. A metal layer 917 can be formed on the lower surface of the lower subunit 901 for improving heat dissipation.

Figure 10A:
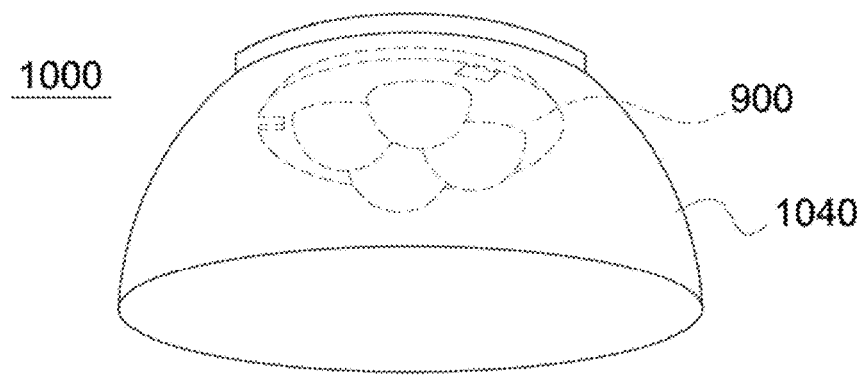
FIGS. 10A-10B illustrates a lighting apparatus of an embodiment in the present disclosure.
Figure 10B:
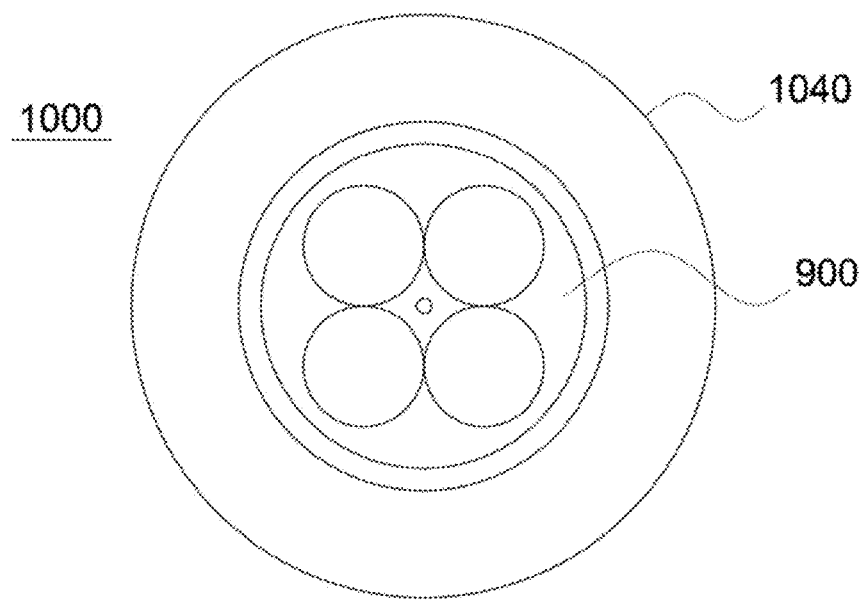

FIGS. 10A-10B illustrate a lighting apparatus of an embodiment in the present disclosure. The lighting apparatus 1000 includes an optoelectronic device module 900, a case 1040, a power supply circuit (not illustrated) to supply current to the optoelectronic device module 900, and a control unit (not illustrated) to control the power supply circuit. The lighting apparatus 1000 can be an illumination device, such as street lamps, headlights or indoor illumination light source, and can be a traffic sign or a backlight module of the display panel.

Figure 11:
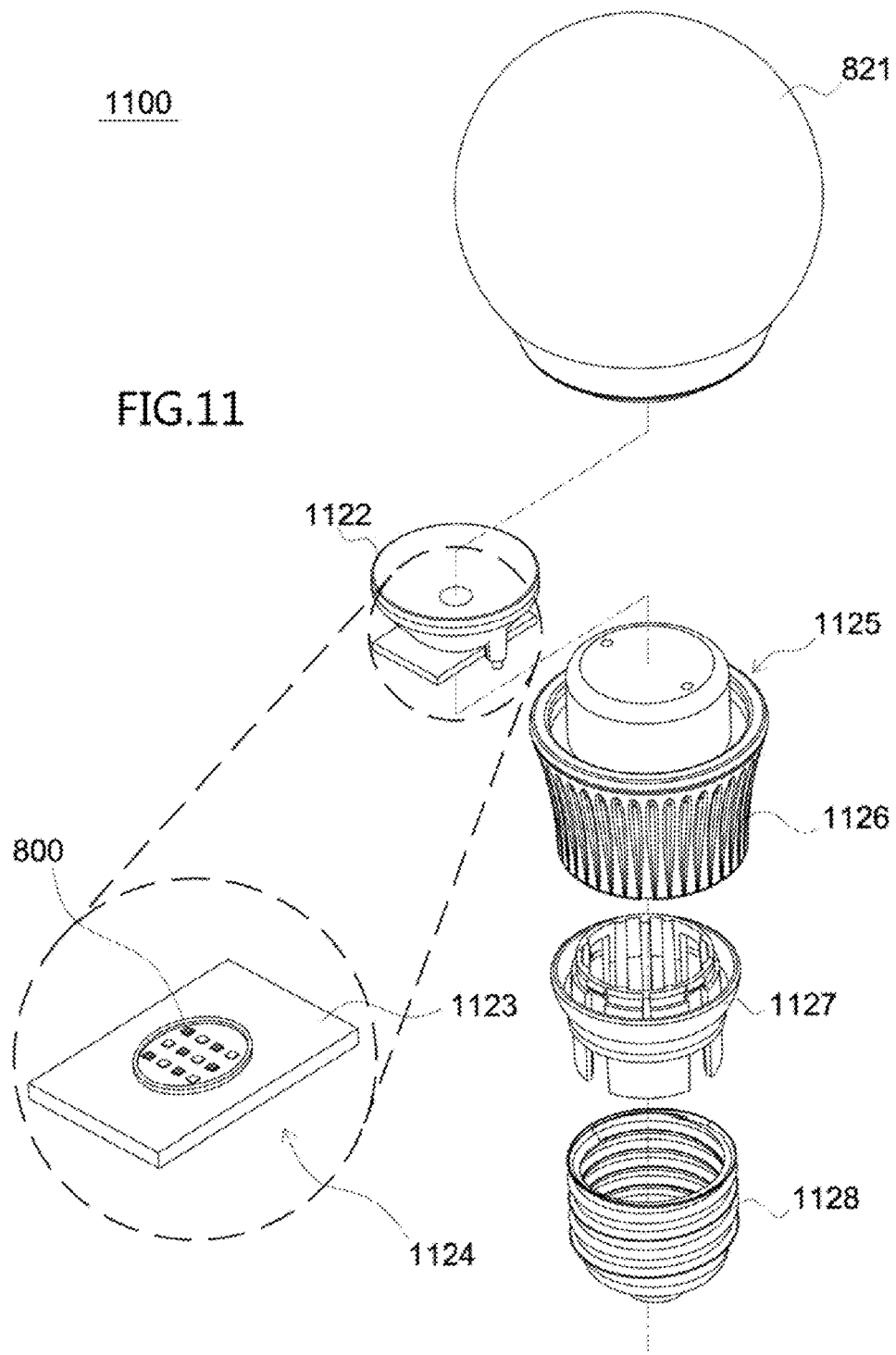
FIG. 11 is an explosive diagram of a bulb in accordance with an embodiment of the present application.

FIG. 11 illustrates an explosive diagram of a bulb in accordance with another application of the present application. The bulb 1100 comprises a cover 1121, a lens 1122, a lighting module 1124, a lamp holder 1125, a heat sink 1126, a connecting part 1127, and an electrical connector 1128. The lighting module 1124 comprises a carrier 1123 and a plurality of optoelectronic devices 800 of any one of the above mentioned embodiments on the carrier 1123.

Specifically, the optoelectronic device comprises light-emitting diode (LED), photodiode, photo resister, laser diode, infrared emitter, organic light-emitting diode, and solar cell. The substrate 10, 20, 30, 40, 50, 80 can be a growing or carrying base. The material of the substrate 10, 20, 30, 40, 50, 80 comprises an electrically conductive substrate, electrically insulating substrate, transparent substrate, or opaque substrate. The material of the electrically conductive substrate can be metal such as Ge and GaAs, oxide such as LiAlO₂ and ZnO, nitrogen compound such as GaN and AlN, phosphide such as InP, silicon compound such as SiC, or Si. The material of the transparent substrate can be chosen from sapphire (Al₂O₃), LiAlO₂, ZnO, GaN, AlN, glass, diamond, CVD diamond, diamond-like carbon (DLC), spinel (MgAl₂O₄), SiO$_x$, or LiGaO₂.

The first conductivity type semiconductor layer 124, 224, 324, 424, 524, 821 and the second conductivity type semiconductor layer 120, 220, 823 are different in electricity, polarity or dopant, or are different semiconductor materials used for providing electrons and holes, wherein the semiconductor material can be single semiconductor material layer or multiple semiconductor material layers. The polarity can be chosen from any two of p-type, n-type and i-type. The active layer 122, 222, 822 is disposed between the first conductivity type semiconductor layer 124, 224, 324, 424, 524, 821 and the second conductivity type semiconductor layer 120, 220, 823 respectively where the electrical energy and the light energy can be converted or stimulated converted. The devices which can convert or stimulated convert the electrical energy into the light energy are like light-emitting diode, liquid crystal display, and organic light-emitting diode. The devices which can convert or stimulated convert the light energy into the electrical energy are like solar cell and light emitting diode. The material of the first conductivity type semiconductor layer 124, 224, 324, 424, 524, 821 the active layer 122, 222, 822 and the second conductivity type semiconductor layer 120, 220, 823 comprises one element selected from the group consisting of Ga, Al, In, As, P, N, Si, and the combination thereof.

The optoelectronic device of another embodiment in the application is a light-emitting diode, of which the light spectrum can be adjusted by changing the essentially physical or chemical factor of the single semiconductor material layer or the multiple semiconductor material layers. The material of the single semiconductor material layer or the multiple semiconductor material layers can contain elements selected from Al, Ga, In, P, N, Zn, O, or the combination thereof. The structure of the active layer (not illustrated) can be single heterostructure (SH), double heterostructure (DH), double-side double heterostructure (DDH) or multi-quantum well (MQW), wherein the wavelength of the light emitted from the active layer (not illustrated) can be changed by adjusting the number of the pairs of MQW.

In one embodiment of the application, a buffer layer (not illustrated) can be selectively disposed between the first conductivity type semiconductor layer 124, 224, 324, 424, 524, 821 and the substrate 10, 20, 30, 40, 50, 80 The buffer layer is between the two material systems to transit the material system of the substrate 10, 20, 30, 40, 50, 80 to the material system of the first conductivity type semiconductor layer 124, 224, 324, 424, 524, 821. For the structure of the light-emitting diode, the buffer layer is used to reduce the crystal mismatch between two materials. On the other hand, the buffer layer comprises a single layer, multiple layers or a structure which comprises two materials or two separated structures. The material of the buffer layer can be selected from organic material, inorganic material, metal or semiconductor material. The structure of the buffer layer can be a reflector layer, a thermally conductive layer, an electrically conductive layer, an ohmic contact layer, an anti-deformation layer, a stress release layer, a bonding layer, a wavelength conversion layer or a mechanically fixing structure. In one embodiment, the material of the buffer layer can be AlN or GaN, and the buffer layer can be formed by sputtering or atomic layer deposition (ALD).

In the aforementioned embodiments, the first transparent conductive oxide layer 14 and 24, the second transparent conductive oxide layer 28, 48, 58, the transparent conductive oxide layer 83 can be made of indium tin oxide (ITO), cadmium tin oxide (CTO), antimony tin oxide, zinc indium oxide, aluminum zinc oxide, zinc antimony oxide, or the combinations thereof; and is formed by an E-beam evaporation method, an ion-sputtering method, a thermal-evaporation method, or any combination thereof. Taking ITO as an example, the thickness of the first transparent conductive oxide layer 14 and 24, the second transparent conductive oxide layer 28, 48, 58, the transparent conductive oxide layer 83 is from 50 µm to 1 µm and the transmissivity is above 50% when the range of the related wavelength is from 300 µm to 700 µm.

In the aforementioned embodiments, the metal bonding layer 41, 51 is made of indium (In), tin (Sn), gold-tin (AuSn), or the combination thereof.

The DBR layer 38 is formed by stacked semiconductor layers and the reflective layers 49, 59 are made of In, Sn, Ai, Au, Pt, Zn, Ag, Ti, Pb, Pd, Ge, Cu, AuBe, AuGe, Ni, PbSn, AuZn, or the combination thereof. The first and second reflective metal layers 17, 27, 30, the reflective layer 86 are made of Al or Ag.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

Although the drawings and the illustrations above are corresponding to the specific embodiments individually, the element, the practicing method, the designing principle, and the technical theory can be referred, exchanged, incorporated, collocated, coordinated except they are conflicted, incompatible, or hard to be put into practice together.

Although the present application has been explained above, it is not the limitation of the range, the sequence in practice, the material in practice, or the method in practice. Any modification or decoration for present application is not detached from the spirit and the range of such.

What is claimed is:

1. A light-emitting device, comprising:
   a semiconductor contact layer having a rough top surface, wherein the rough top surface comprises any two adjacent crests having a highest point respectively and a trough having a lowest point between the two adjacent crests; and
   a transparent current spreading layer having a top surface on the semiconductor contact layer;
   wherein the top surface of the transparent current spreading layer comprises any two adjacent crests having a highest point respectively and a trough having a lowest point between the two adjacent crests;
   wherein the rough top surface of the semiconductor contact layer is substantially directly under the top surface of the transparent current spreading layer;
   wherein two oblique lines formed by connecting the highest points and the lowest point of the rough top surface on the semiconductor contact layer, and a first angle $\theta_1$ formed between the two oblique lines;
   wherein two oblique lines formed by connecting the highest points and the lowest point of the top surface on the transparent current spreading layer, and a second angle $\theta_2$ formed between the two oblique lines;
   wherein a difference between the first angle $\theta_1$ and the second angle $\theta_2$ is not greater than 10 degrees, or the first angle $\theta_1$ is substantially the same as the second angle $\theta_2$.

2. The light-emitting device according to claim 1, further comprising a flat region on the trough of the rough top surface of the semiconductor contact layer.

3. The light-emitting device according to claim 2, further comprising a flat region on the trough of the top surface of the transparent current spreading layer.

4. The light-emitting device according to claim 1, wherein a height difference $H_1$ between the lowest point on the trough of the top surface of the transparent current spreading layer and the lowest point on the trough of the rough top surface of the semiconductor contact layer is greater than 0.

5. The light-emitting device according to claim 4, wherein a height difference $H_2$ or $H_3$ between the highest point on the crest of the top surface of the transparent current spreading layer and the highest point on the crest of the rough top surface of the semiconductor contact layer is greater than 0.

6. The light-emitting device according to claim 5, wherein a ratio of the height difference $H_1$ and the height difference $H_2$ is between 0.1 and 10.

7. The light-emitting device according to claim 5, wherein a ratio of the height difference $H_1$ and the height difference $H_3$ is between 0.1 and 10.

8. The light-emitting device according to claim 1, further comprising a substrate below the semiconductor contact layer.

9. The light-emitting device according to claim 8, further comprising a light-emitting structure between the substrate and the semiconductor contact layer.

10. The light-emitting device according to claim 9, wherein the light-emitting structure comprises a first conductivity type semiconductor layer on the substrate, an active layer on the first conductivity type semiconductor layer, and a second conductivity type semiconductor layer on the active layer.

11. The light-emitting device according to claim 1, wherein a material of the semiconductor contact layer comprises one or more elements selected from a group consisting of gallium, aluminum, indium, arsenic, phosphorous, nitrogen, and silicon.

12. The light-emitting device according to claim 1, wherein the transparent current spreading layer comprises a metal oxide or a metal nitride.

13. The light-emitting device according to claim 8, wherein the substrate is a growth base or a carrier base.

14. The light-emitting device according to claim 8, wherein a material of the light-emitting structure comprises one or more elements selected from a group consisting of gallium, aluminum, indium, arsenic, phosphorous, nitrogen, and silicon.

15. The light-emitting device according to claim 1, wherein the rough top surface of the semiconductor contact layer comprises a cavity shaped as cone or pyramid, wherein the cavity extends from the rough top surface of the semiconductor contact layer downwards to inner of the semiconductor contact layer.

* * * * *